(12) United States Patent
Taylor et al.

(10) Patent No.: US 7,463,093 B2
(45) Date of Patent: Dec. 9, 2008

(54) VARIABLE GAIN AMPLIFIER

(75) Inventors: Stewart S. Taylor, Beaverton, OR (US); Jon S. Duster, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 11/724,707

(22) Filed: Mar. 16, 2007

(65) Prior Publication Data

US 2008/0224775 A1   Sep. 18, 2008

(51) Int. Cl.
*H03F 3/45* (2006.01)
(52) U.S. Cl. ................................. 330/254; 330/311
(58) Field of Classification Search ............... 330/253, 330/254, 278, 279, 311
See application file for complete search history.

(56) References Cited

U.S. PATENT DOCUMENTS 7,199,661 B1 * 4/2007 Shirvani-Mahdavi et al. .... 330/254
7,321,266 B2 * 1/2008 Chiang ....................... 330/254

* cited by examiner

*Primary Examiner*—Khanh V Nguyen
(74) *Attorney, Agent, or Firm*—Dana B. Lemoine; Lemoine Patent Services, PLLC

(57) ABSTRACT

A variable gain amplifier includes multiple gain stages. Each gain stage includes a gain transistor and a cascode transistor to form a cascode amplifier, and a current diversion transistor to divert current away from a cascode transistor to reduce gain in the stage. A control circuit is included to maintain substantially constant drain-to-source voltage and drain current in the gain transistor.

13 Claims, 4 Drawing Sheets

VARIABLE GAIN AMPLIFIER

FIELD

The present invention relates generally to amplifier circuits, and more specifically to amplifier circuits with variable gain.

BACKGROUND

FIG. 1 is a schematic of a prior art variable gain amplifier. Transistors 102 and 108 form two of several discrete gain stages for the variable gain amplifier. Their gates are DC biased from diode connected current mirror transistor 101 through isolating resistor 130. Transistors 104 and 106 are common gate amplifiers which, with transistors 102 and 108, form cascode amplifiers, known to those skilled in the art. The gates of transistors 104 and 106 are connected to diode connected transistor 103 with node voltage $V_{BIAS2}$. The drains of transistors 104 and 106 are connected together, and to inductor 140 for tuning and biasing. The output signal, $V_{OUT}$, is typically connected to the next stage, possibly through a series capacitor not shown that could be part of a matching network, or just a DC block. The next stage might typically be another amplifying transistor such as the input stage of a mixer.

Transistors 105 and 107 are switching transistors having sources connected to the sources of transistors 104 and 106, respectively. Their gates are driven by voltages $V_{L1}$ and $V_{L2}$ from interface circuits not shown. When $V_{L1}$ and $V_{L2}$ are low, transistors 105 and 107 are off and the DC current from transistors 102 and 108 flow in transistors 104 and 106, respectively. For this case, the variable gain amplifier achieves maximum gain because all of signal current from the drains of transistors 102 and 108 flows through transistors 104 and 106 to the load formed by inductor 140. If either $V_{L1}$ or $V_{L2}$ are high, the current from transistor 102 or 108 is steered away from transistors 104 and 106, respectively, resulting in a smaller signal at the output. The relative size of transistors 102 and 108 might typically be chosen to be 2 to 1, for an approximate gain step of 6 dB, although this is a degree of freedom and can vary according to the design. More stages can be added for additional gain steps for broader gain variation/control.

A limitation of the prior art shown in FIG. 1 is that when either $V_{L1}$ or $V_{L2}$ are high, the drain voltage of transistor 102 ($V_1$) or transistor 108 ($V_2$) increases (e.g., $V_1$ or $V_2$ may increase by 300-600 mV). This causes the drain current of transistor 102 or 108 to increase by 30-50%, depending on the short channel affects of the transistor (channel length modulation and drain induced barrier lowering). Thus, the DC current and power of the variable gain amplifier increase as the gain is reduced. Further, as the current varies with gain setting, the input capacitance of the transistors changes, degrading the input match (S11) of the variable gain amplifier. If the swing in $V_{L1}$ and $V_{L2}$ is reduced to lessen the impact of this, some of the current that is meant to be diverted away for gain control remains, causing the gain step to be other than the design value, and to possibly vary with process, temperature, and supply voltage.

DESCRIPTION OF EMBODIMENTS

Figure 1:
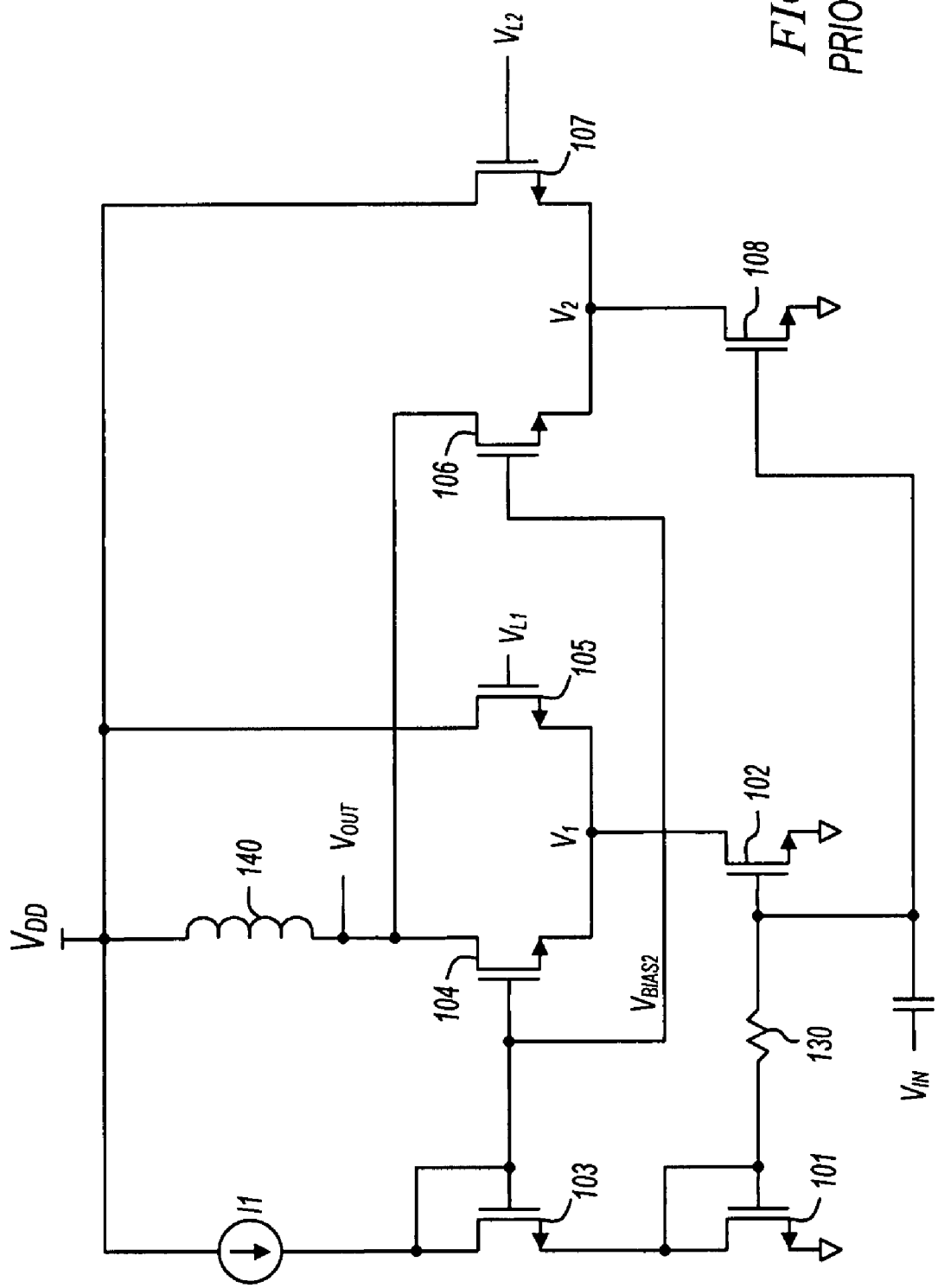
FIG. 1 shows a prior art variable gain amplifier.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
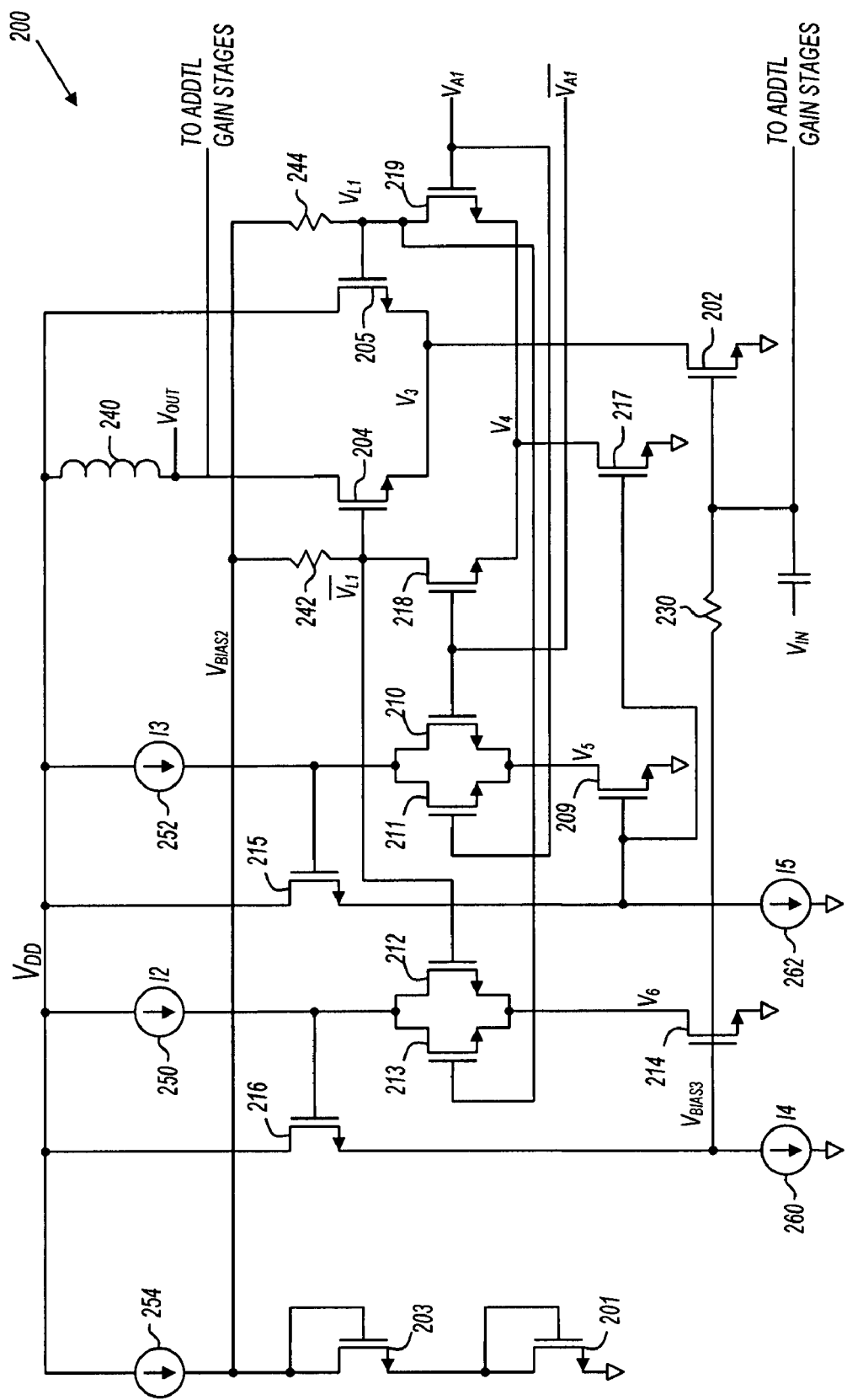
FIGS. 2 and 3 show variable gain amplifier circuits in accordance with various embodiments of the present invention.

FIG. 2 shows a variable gain amplifier circuit in accordance with various embodiments of the present invention. Amplifier 200 is shown with one gain stage, although any number of gain stages may be included in parallel without departing from the scope of the present invention. The gain stage includes gain transistor 202, cascode transistor 204, and current diversion transistor 205. Gain transistor 202 has a gate DC biased by $V_{BIAS3}$, and driven by the input signal $V_{IN}$. Gain transistor 202 and cascode transistor 204 form a cascode amplifier when the drain current of gain transistor 202 is flowing through cascode transistor 204. Inductor 240 forms a load, and the output signal $V_{OUT}$ is produced at the junction between inductor 240 and the drain of cascode transistor 204.

Current diversion transistor 205 is used to divert current provided by gain transistor 202 away from cascode transistor 204 to reduce the gain. For example, if current diversion transistor 205 provides a low impedance path from drain-to-source, then the current provided by gain transistor 202 will be diverted from cascode transistor 204 to transistor 205, and the output signal swing will be reduced.

The gain stage also includes transistors 217, 218, and 219. Transistors 218 and 219 form a differential pair with transistor 217 operating as a current source. Resistors 242 and 244 are load devices for the differential pair formed by transistors 218 and 129. The differential pair of transistors 218 and 219 are driven by differential logic signals $V_{A1}$ and $\overline{V_{A1}}$, and produce differential logic signals $V_{L1}$ and $\overline{V_{L1}}$ on intermediate nodes.

Cascode transistor 204 and current diversion transistor 205 have gates that are driven by differential logic signals $V_{L1}$ and $\overline{V_{L1}}$. This results in a larger drive signal for more complete switching (constant gain), and maintains $V_3$ at a substantially constant voltage independent of gain state. Because $V_3$ (drain voltage of gain transistor 202) remains at substantially the same potential whether transistor 205 is on or off, the drain current in transistor 202 remains substantially constant, independent of gain state, as does the gate-to-source capacitance (Cgs) and the gate-to-drain capacitance (Cgd), which maintains S11 substantially constant.

The gain stage also includes a control circuit having transistors 210, 211, 209, and 215 and current sources 252 and 262. Transistors 210 and 211 have their drains coupled together and their sources coupled together. Transistor 211 has a gate coupled to the gate of transistor 219, and transistor 210 has a gate coupled to the gate of transistor 218. Transistor 209 is a current source transistor that provides current to transistors 210 and 211. Transistor 215 is a feedback transistor having a gate coupled to the drains of transistors 210 and 211, and having a source coupled to the gate of transistor 209. Without transistors 210, 211, and 215, and current source 262, the combination of current source 252 and transistor 209 form a current mirror circuit to bias the gate of transistor 217. With the addition of transistors 210, 211, and 215, and current source 262, a feedback loop is formed within the control circuit that maintains the drain-to-source voltage of transistor 209 ($V_5$) at substantially the same value as that of transistor 217 ($V_4$). Because of this, the drain current in transistor 217 is a scaled version of the drain current in transistor 209, which equals I3.

$V_{L1}$ and $\overline{V_{L1}}$ are well-controlled in a similar manner by employing a second control circuit that includes transistors 214, 212, 213, and 216, and current sources 250 and 260. Transistors 212 and 213 have their drains coupled together and their sources coupled together. Transistor 212 has a gate coupled to the gate of cascode transistor 204, and transistor 213 has a gate coupled to the gate of current diversion transistor 205. Transistor 214 is a current source transistor that provides current to transistors 212 and 213. Transistor 216 is a feedback transistor having a gate coupled to the drains of transistors 212 and 213, and having a source coupled to the gate of transistor 214. Without transistors 212, 213, and 216, and current source 260, the combination of current source 250 and transistor 214 form a current mirror circuit to bias the gate of transistor 202. With the addition of transistors 212, 213, and 216, and current source 260, a feedback loop is formed within the control circuit that maintains the drain-to-source voltage of transistor 214 ($V_6$) at substantially the same value as that of transistor 202 ($V_3$). Because of this, the drain current in transistor 202 is a scaled version of the drain current in transistor 214, which equals I2.

In operation, gain stages can be individually controlled by changing the state of the control input ($V_{A1}$ and $\overline{V_{A1}}$ in this example). As shown in FIG. 2, $V_{A1}$ and $\overline{V_{A1}}$ are differential signals. Accordingly, the gain of circuit 200 may be changed by applying a differential voltage to control inputs $V_{A1}$ and $\overline{V_{A1}}$. The control signals may also be controlled single ended. For example, $\overline{V_{A1}}$ may be held at a substantially constant value, and $V_{A1}$ may be switched high to add the gain stage in the circuit, or $V_{A1}$ may be switched low to remove the gain stage from the circuit. Additional gain stages may be added in parallel by coupling the input signal and output signals as shown in FIG. 2. Each stage may have separate control signals to independently operate the gain stage. Transistors 201 and 203, and current source 254 provide a bias circuit that may be shared among all the gain stages. Alternatively, each gain stage may include a separate bias circuit.

The transistors in FIG. 2 are shown as field effect transistors, and specifically as N-type metal oxide semiconductor field effect transistors (MOSFETs). Other types of switching or amplifying elements may be utilized for the various transistors of circuit 200 without departing from the scope of the present invention. For example, the transistors of circuit 200 may be P-type MOSFETs, junction field effect transistors (JFETs), metal semiconductor field effect transistors (MESFETs), or any device capable of performing as described herein.

Figure 3:
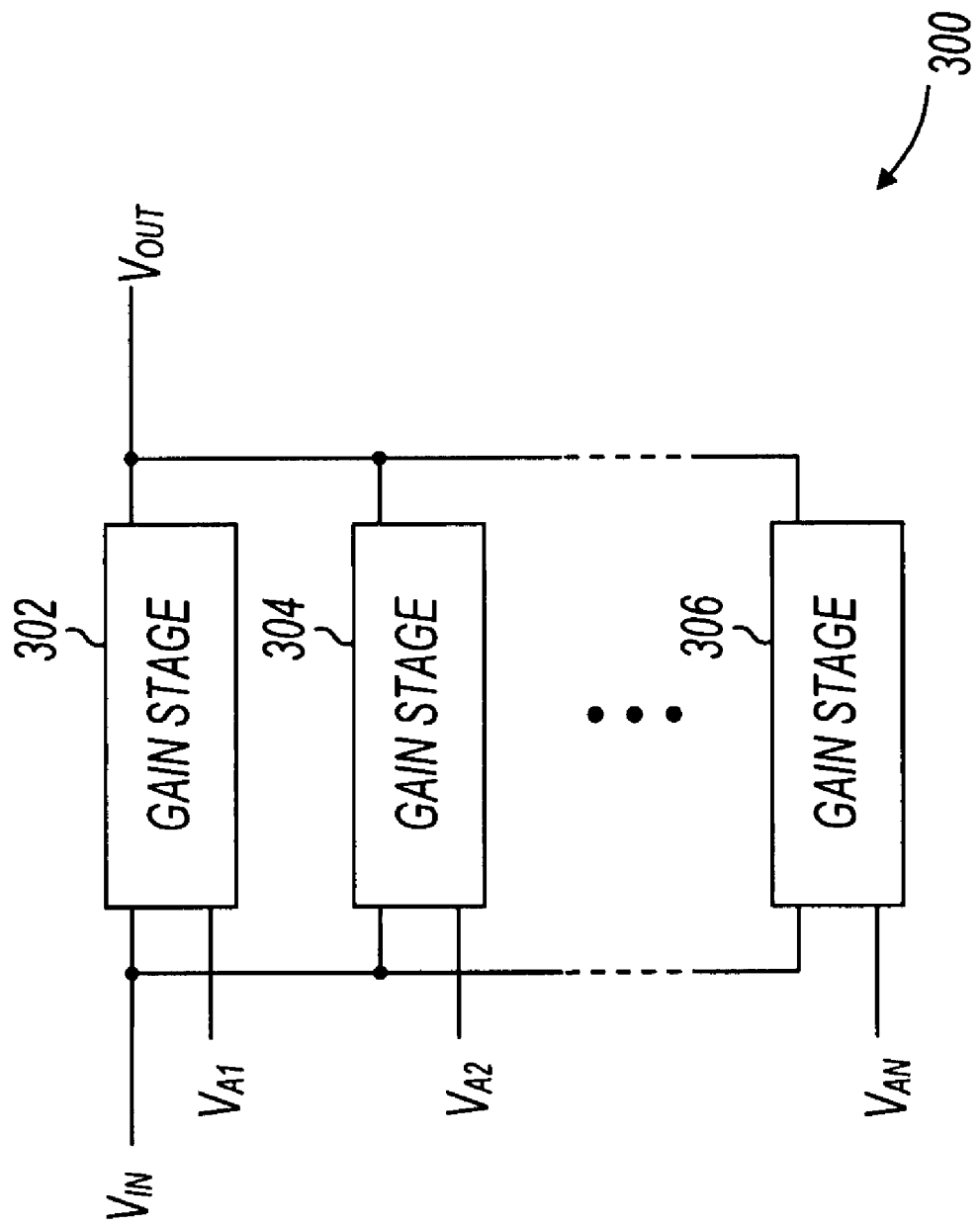

FIG. 3 shows a variable gain amplifier circuit in accordance with various embodiments of the present invention. Amplifier 300 includes multiple gain stages coupled in parallel. As shown in FIG. 3, amplifier 300 includes gain stages 302, 304, and 306, but is not limited to three gain stages in parallel.

Each of the gain stages receives the input signal $V_{IN}$ in parallel, and is coupled to produce the output signal $V_{OUT}$ in parallel. Each gain stage also receives one or more control signals. For example, gain stage 302 receives $V_{A1}$, gain stage 304 receives $V_{A2}$, and gain stage 306 receives $V_{AN}$. Each of gain stages 302, 304, and 306 may include a variable gain amplifier circuit such as variable gain amplifier circuit 200 (FIG. 2). Each gain stage may be separately controlled, and may provide a different amount of gain. For example, in some embodiments, the various gain stages may each provide the same gain, or they may be binary weighted.

Figure 4:
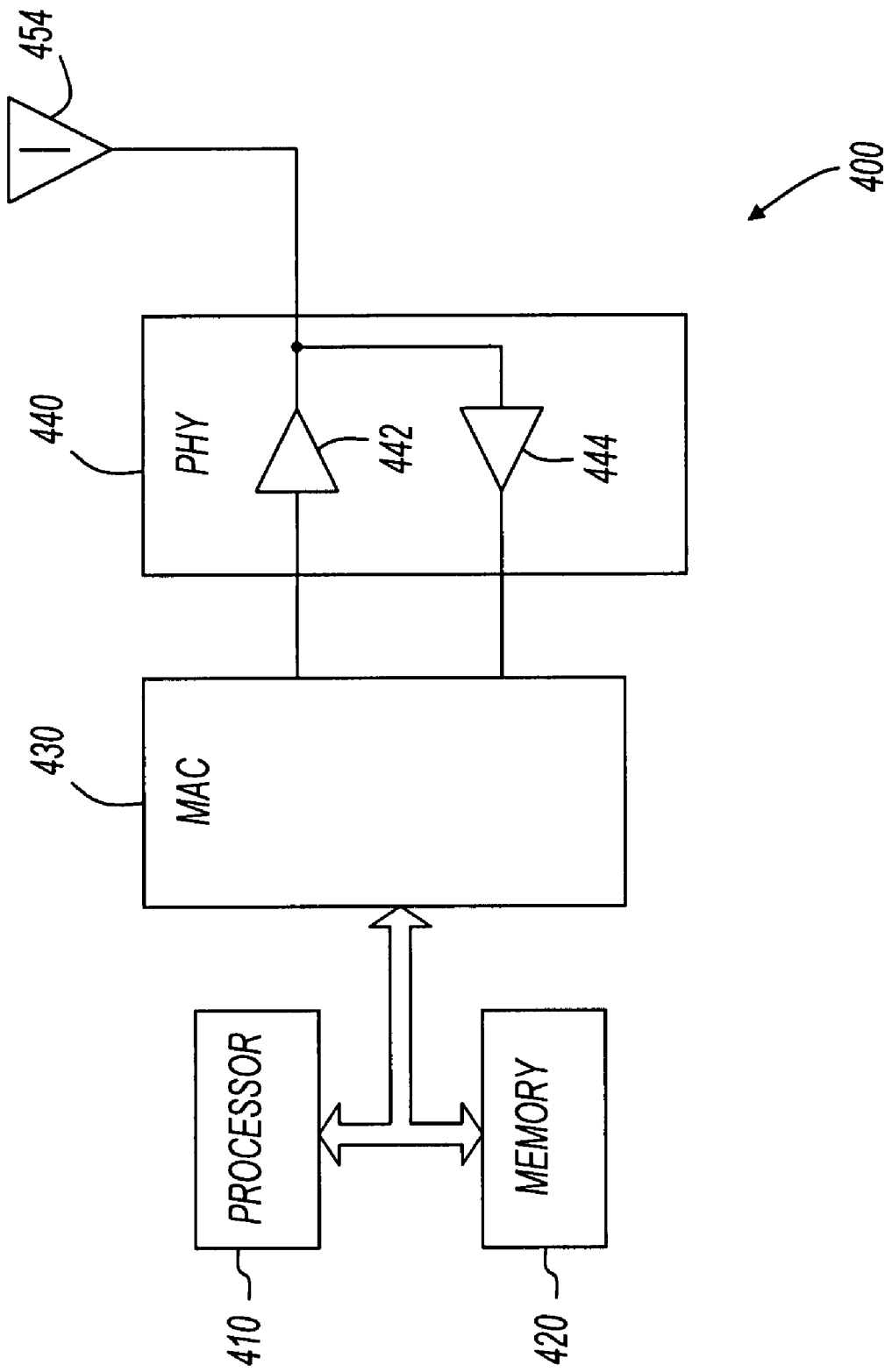
FIG. 4 shows a diagram of an electronic system in accordance with various embodiments of the present invention.

FIG. 4 shows a system diagram in accordance with various embodiments of the present invention. Electronic system 400 includes antenna 454, physical layer (PHY) 440, media access control (MAC) layer 430, processor 410, and memory 420. In operation, system 400 sends and receives signals using antenna 454, and the signals are processed by the various elements shown in FIG. 4.

Antenna 454 may include one or more antennas. For example, antenna 454 may include a single directional antenna or an omni-directional antenna. As used herein, the term omni-directional antenna refers to any antenna having a substantially uniform pattern in at least one plane. For example, in some embodiments, antenna 454 may include a single omni-directional antenna such as a dipole antenna, or a quarter wave antenna. Also for example, in some embodiments, antenna 454 may include a single directional antenna such as a parabolic dish antenna or a Yagi antenna. In still further embodiments, antenna 454 may include multiple physical antennas. For example, in some embodiments, multiple antennas are utilized for multiple-input-multiple-output (MIMO) processing or spatial-division multiple access (SDMA) processing.

Physical layer (PHY) 440 is coupled to antenna 454 to interact with other wireless devices. PHY 440 may include circuitry to support the transmission and reception of radio frequency (RF) signals. For example, as shown in FIG. 4, PHY 440 includes power amplifier (PA) 442 and low noise amplifier (LNA) 444. Low noise amplifier 444 may include a variable gain amplifier such as those described above with reference to FIGS. 2 and 3. In some embodiments, PHY 440 includes additional functional blocks to perform filtering, frequency conversion or the like.

PHY 440 may be adapted to transmit/receive and modulate/demodulate signals of various formats and at various frequencies. For example, PHY 440 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Example systems represented by FIG. 4 include cellular phones, personal digital assistants, wireless local area network interfaces, wireless wide area network stations and subscriber units, and the like. Many other systems uses for variable gain amplifiers exist. For example, LNA 442 may be used in a desktop computer, a network bridge or router, or any other system without an antenna.

Media access control (MAC) layer 430 may be any suitable media access control layer implementation. For example, MAC 430 may be implemented in software, or hardware or any combination thereof. In some embodiments, a portion of MAC 430 may be implemented in hardware, and a portion may be implemented in software that is executed by processor 410. Further, MAC 430 may include a processor separate from processor 410.

Processor 410 may be any type of processor capable of communicating with memory 420, MAC 430, and other functional blocks (not shown). For example, processor 410 may be a microprocessor, digital signal processor (DSP), microcontroller, or the like.

Memory 420 represents an article that includes a machine readable medium. For example, memory 420 represents a random access memory (RAM), dynamic random access memory (DRAM), static random access memory (SRAM), read only memory (ROM), flash memory, or any other type of article that includes a medium readable by processor 410. Memory 420 may store instructions for performing software driven tasks. Memory 420 may also store data associated with the operation of system 400.

Although the various elements of system 400 are shown separate in FIG. 4, embodiments exist that combine the circuitry of processor 410, memory 420, MAC 430, and all or a portion of PHY 440 in a single integrated circuit. For example, MAC 430 and PA 442 may be combined together on an integrated circuit die. In some embodiments, the various elements of system 400 may be separately packaged and mounted on a common circuit board. In other embodiments, the various elements are separate integrated circuit dice packaged together, such as in a multi-chip module, and in still further embodiments, various elements are on the same integrated circuit die.

Amplifier circuits, bias circuits, feedback circuits, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of amplifier circuit 200 (FIG. 2) may be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An amplifier circuit comprising:
   a differential pair of transistors, and a first current source transistor coupled to provide drain-to-source current to the differential pair of transistors, the differential pair of transistors coupled to drive first and second intermediate nodes;
   a gain transistor and a cascode transistor, the gain transistor having a gate coupled to a signal input node, and the cascode transistor having a gate coupled to the first intermediate node; and
   a current diversion transistor coupled to divert current provided by the current source transistor away from the cascode transistor, the current diversion transistor having a gate coupled to the second intermediate node.

2. The amplifier circuit of claim 1 further comprising:
   third and fourth transistors having drains coupled together and sources coupled together, the third transistor having a gate coupled to the first intermediate node, and the fourth transistor having a gate coupled to the second intermediate node.

3. The amplifier circuit of claim 2 further comprising a second current source transistor coupled to provide current to the third and fourth transistors, the second current source transistor having a gate coupled to the gate of the gain transistor.

4. The amplifier circuit of claim 3 further comprising a feedback transistor having a gate coupled to drains of the third and fourth transistors, and a source coupled to the gate of the second current source transistor.

5. The amplifier circuit of claim 4 further comprising:
   fifth and sixth transistors having drains coupled together and sources coupled together, and having gates coupled to gates of the differential pair of transistors.

6. The amplifier circuit of claim 5 further comprising a third current source transistor coupled to provide current to the fifth and sixth transistors, the third current source transistor having a gate coupled to the gate of the first current source transistor.

7. The amplifier circuit of claim 6 further comprising a second feedback transistor having a gate coupled to drains of the fifth and sixth transistors, and a source coupled to the gate of the third current source transistor.

8. A variable gain amplifier having multiple stages coupled in parallel, wherein each of the multiple stages comprises:
   a gain transistor and a cascode transistor configured as a cascode amplifier;
   a current diversion transistor to divert current away from the cascode transistor; and
   a control circuit coupled to a gate of the gain transistor, a gate of the cascode transistor, and a gate of the current diversion transistor, the control circuit including a feedback loop to reduce voltage variation at a junction between the gain transistor, the cascode transistor and the current diversion transistor.

9. The variable gain amplifier of claim 8 wherein the feedback loop includes first and second transistors having sources coupled together and drains coupled together, the first transistor having a gate coupled to the gate of the cascode transistor and the second transistor having a gate coupled to the gate of the current diversion transistor.

10. The variable gain amplifier of claim 9 wherein the feedback loop further comprises a third transistor coupled to provide current to the first and second transistors, the third transistor having a gate coupled to the gate of the gain transistor.

11. The variable gain amplifier of claim 10 wherein the feedback loop further comprises a fourth transistor having a gate coupled to the drains of the first and second transistors, and a source coupled to the coupled to the gate of the third transistor.

12. The variable gain amplifier of claim 8 wherein each stage further comprises a differential pair of transistors coupled to provide a differential signal to the cascode transistor and the current diversion transistor.

13. The variable gain amplifier of claim 12 wherein each stage further comprises a second control circuit having a feedback loop to reduce voltage variation on a node coupled to sources of the differential pair of transistors.

* * * * *